(12) United States Patent
Xie et al.

(10) Patent No.: US 10,886,378 B2
(45) Date of Patent: Jan. 5, 2021

(54) METHOD OF FORMING AIR-GAP SPACERS AND GATE CONTACT OVER ACTIVE REGION AND THE RESULTING DEVICE

(71) Applicant: GLOBALFOUNDRIES Inc., Grand Cayman (KY)

(72) Inventors: Ruilong Xie, Niskayuna, NY (US); Julien Frougier, Albany, NY (US); Chanro Park, Clifton Park, NY (US); Kangguo Cheng, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 42 days.

(21) Appl. No.: 16/238,173

(22) Filed: Jan. 2, 2019

(65) Prior Publication Data
US 2020/0212192 A1   Jul. 2, 2020

(51) Int. Cl.
| | | |
|---|---|---|
| *H01L 21/02* | (2006.01) | |
| *H01L 29/49* | (2006.01) | |
| *H01L 21/8234* | (2006.01) | |
| *H01L 29/78* | (2006.01) | |
| *H01L 29/45* | (2006.01) | |
| *H01L 23/535* | (2006.01) | |
| *H01L 21/285* | (2006.01) | |
| *H01L 21/768* | (2006.01) | |
| *H01L 29/66* | (2006.01) | |
| *H01L 27/088* | (2006.01) | |

(52) U.S. Cl.
CPC .... *H01L 29/4991* (2013.01); *H01L 21/02167* (2013.01); *H01L 21/28518* (2013.01); *H01L 21/7682* (2013.01); *H01L 21/76895* (2013.01); *H01L 21/76897* (2013.01); *H01L 21/823418* (2013.01); *H01L 21/823431* (2013.01); *H01L 21/823468* (2013.01); *H01L 21/823475* (2013.01); *H01L 23/535* (2013.01); *H01L 27/0886* (2013.01); *H01L 29/45* (2013.01); *H01L 29/66795* (2013.01); *H01L 29/7851* (2013.01)

(58) Field of Classification Search
USPC ........................................... 257/384
See application file for complete search history.

(56) References Cited

U.S. PATENT DOCUMENTS

| | | | |
|---|---|---|---|
| 5,869,379 A | 2/1999 | Gardner et al. | |
| 5,915,182 A | 6/1999 | Wu | |
| 6,297,108 B1 | 10/2001 | Chu | |
| 6,596,599 B1 | 7/2003 | Guo | |
| 7,741,663 B2 | 6/2010 | Hause et al. | |

(Continued)

*Primary Examiner* — Niki H Nguyen
(74) *Attorney, Agent, or Firm* — Ditthavong & Steiner, P.C.

(57) ABSTRACT

A device including a substrate and at least one fin formed over the substrate. At least one transistor is integrated with the fin at a top portion of the fin. The transistor includes an active region comprising a source, a drain and a channel region between the source and drain. A gate structure is formed over the channel region, and the gate structure includes a HKMG and air-gap spacers formed on opposite sidewalls of the HKMG. Each of the air-gap spacers includes an air gap that is formed along a trench silicide region, and the air-gap is formed below a top of the HKMG. A gate contact is formed over the active region.

18 Claims, 11 Drawing Sheets

(56) References Cited

U.S. PATENT DOCUMENTS

| | | |
|---|---|---|
| 8,124,531 B2 | 2/2012 | Chandrashekar et al. |
| 8,637,930 B2 | 1/2014 | Ando et al. |
| 9,368,572 B1 | 6/2016 | Cheng et al. |
| 9,735,246 B1 | 8/2017 | Basker et al. |
| 9,985,107 B2 * | 5/2018 | Cheng ............... H01L 29/41791 |
| 10,211,092 B1 * | 2/2019 | Cheng ............... H01L 29/66795 |
| 10,431,495 B1 * | 10/2019 | Cheng ............... H01L 21/76897 |
| 2007/0184615 A1 | 8/2007 | Brazzelli et al. |
| 2010/0055904 A1 | 3/2010 | Chen et al. |
| 2010/0102363 A1 | 4/2010 | Hause et al. |
| 2012/0104512 A1 | 5/2012 | Horak et al. |
| 2013/0049132 A1 | 2/2013 | Doris et al. |
| 2013/0093019 A1 | 4/2013 | Ando et al. |
| 2013/0307032 A1 | 11/2013 | Kamineni et al. |
| 2015/0243544 A1 | 8/2015 | Alptekin et al. |
| 2018/0033863 A1 | 2/2018 | Xie et al. |
| 2018/0138279 A1 | 5/2018 | Xie et al. |
| 2018/0211874 A1 * | 7/2018 | Basker ............... H01L 29/4966 |

* cited by examiner

METHOD OF FORMING AIR-GAP SPACERS AND GATE CONTACT OVER ACTIVE REGION AND THE RESULTING DEVICE

TECHNICAL FIELD

The present disclosure relates to air-gap spacers and gate contacts formed above an active region in a fin field-effect transistor (FinFET), and method of forming the same.

BACKGROUND

With existing processing, air-gap spacers provide a capacitance reduction over conventional spacers, leading to increased performance. Downward scaling benefits can be achieved by forming the gate contact over the active area. Although both air-gap spacers and gate-contact-over-active-area have desirable benefits for semiconductor devices as they continue to delve into advanced technology nodes, they are considered incompatible, due to subway issues, i.e., adverse interactions between the gate contact and the air-gap spacers, and between the source/drain contact and the air-gap spacers.

Prior air-gap spacer schemes form a sacrificial gate cap and gate sidewall spacers, followed by source/drain contact formation. The gate sidewall spacers and gate cap are etched back with a deep reactive ion etching (RIE) which adversely can impact the trench silicide (TS) and high-K metal gate (HKMG) integrity. A non-conformal nitride deposition is formed to reform a sacrificial gate cap and air-gap spacer. However, the sacrificial gate cap is very low and can easily be breached during the source/drain contact formation thus opening the airgap and causing sneak pass issues.

A need therefore exists for a device with improved air-gap spacers fully compatible with gate-contact-over-active-area which circumvent subway issues, between the gate contact and the air-gap spacers, and between the source/drain contact and the air-gap spacers, and a related method of making the device.

SUMMARY

An aspect of the present disclosure is a logic or memory cell having an air-gap formed below a top of a gate metal to prevent the gate contact from coming into contact with the air-gap, even when the gate contact is over an active region. Similarly, another aspect of the present disclosure is a logic or memory cell having an air-gap formed below a top of a gate metal to prevent the source/drain contact from coming into contact with the air-gap.

Another aspect of the present disclosure is a process for forming an air-gap formed below a top of a gate metal to prevent the gate contact from coming into contact with the air-gap, even when the gate contact is over an active region. Similarly, another aspect of the present disclosure is a process of forming an air-gap below a top of a gate metal to prevent the source/drain contact from coming into contact with the air-gap.

According to the present disclosure, some technical effects may be achieved in part by a device including a substrate and at least one fin formed over the substrate. At least one transistor is integrated with the fin at a top portion of the fin. The transistor includes an active region comprising a source, a drain and a channel region between the source and drain. A gate structure is formed over the channel region, and the gate structure includes a HKMG and air-gap spacers formed on opposite sidewalls of the HKMG. Each of the air-gap spacers includes an air gap that is formed along a trench silicide (TS) region, and the air-gap is formed below a top of the HKMG. A gate contact is formed over the active region.

Another aspect of the present disclosure is a method including forming at least one fin on a semiconductor substrate. At least one active region having a source, a drain, and a channel region between the source and drain is formed. At least one gate structure is formed over the channel region. The gate structure includes a HKMG and air-gap spacers formed on opposite sidewalls of the HKMG. Each of the air-gap spacers includes an air gap that is formed along a TS region. The air-gap is formed below a top of the gate electrode. A gate contact is formed over the gate electrode.

A further aspect of the present disclosure is a device including a substrate and a first fin and second fin formed over the substrate. A first transistor is integrated with the first fin at a top portion of the first fin and a second transistor is integrated with the second fin at a top portion of the second fin. The first and second transistors each include an active region including a source, a drain and a channel region between the source and drain. A gate structure is formed over the channel region. The gate structure includes a HKMG and air-gap spacers formed on opposite sidewalls of the HKMG. Each air-gap spacer includes an air gap that is formed formed along a TS region, and the air-gap is formed below a top of the HKMG. A self-aligned gate contact is formed over the active region of the first transistor, and a self-aligned source/drain contact is formed over source or drain of the second transistor.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive. The advantages of the present disclosure may be realized and obtained as particularly pointed out in the appended claims.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves problems associated with the formation of air-gaps spacers to avoid adverse interaction between the gate contact and the air-gap spacers, and between the source/drain contact and the air-gap spacers. The problems are solved, inter alia, by forming air-gap spacers along a TS region. The air-gap is positioned only at a lower level of the air-gap spacer, which is below the top of the metal gate.

Devices in accordance with embodiments of the present disclosure include a substrate and at least one fin formed over the substrate. At least one transistor is integrated with the fin at a top portion of the fin. The transistor includes an active region comprising a source, a drain and a channel region between the source and drain. A gate structure is formed over the channel region, and the gate structure includes a HKMG and air-gap spacers formed on opposite sidewalls of the HKMG. Each of the air-gap spacers includes an air gap that is formed along a TS region, and the air-gap is formed below a top of the HKMG. A gate contact is formed over the active region.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
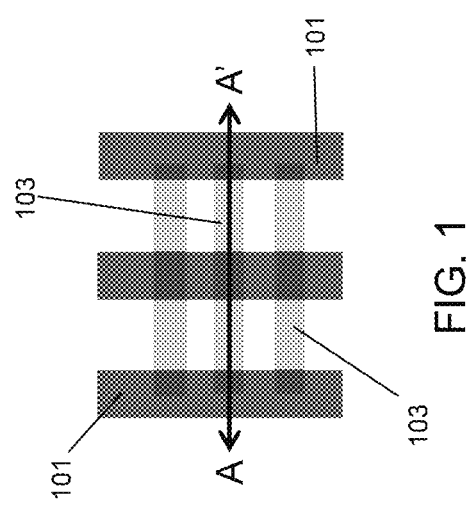
FIG. 1 is a top view of a logic or memory cell, in accordance with an exemplary embodiment.
Figure 2:
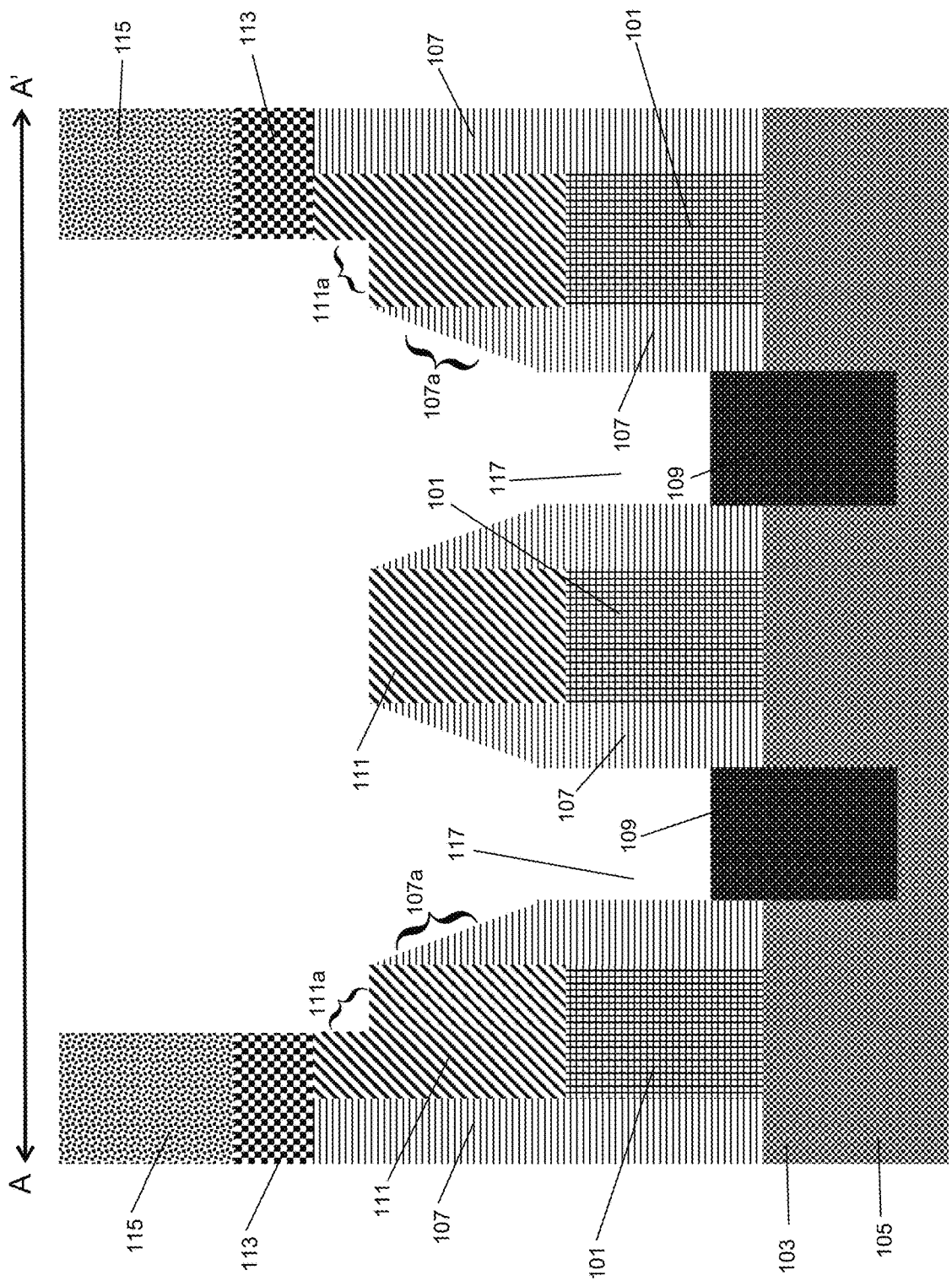
FIGS. 2 through 8 schematically illustrate cross-sectional views of a process flow for forming a logic or memory cell device having air-gap spacers in a FinFET, along the cut lines A-A', in accordance with an exemplary embodiment.

FIG. 1 schematically illustrates a top view of a logic or memory cell with gates 101 and fins 103. Cut line A-A' is shown along one of fins 103 across gates 101. FIG. 2 schematically illustrates a cross-sectional view along cut line A-A' of FIG. 1. Gate structures 101 of a logic or memory cell may be, for example, replacement metal gate (RMG) structures with gates across and perpendicular to previously formed semiconductor fins 103 and a semiconductor substrate 105. The RMG process begins with dummy gate structures to self-align the source and drain implant, and then strips out the dummy gate structures and replaces them with the HKMG 101, which are shown in FIGS. 1 through 11.

Substrate 105 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 105 may in addition or instead include various isolations, dopings and/or device features. Substrate 105 may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

As shown in FIG. 2, fins 103 are formed on substrate 105 to extend upward therefrom, and a shallow trench isolation (STI) region (not shown in this cross-sectional view) is formed on substrate 105 between fins 103. Each dummy gate structure is formed above the STI and adjacent to a pair of fins 103 at a respective channel region.

In FIG. 2 a gate sidewall spacer 107 is then formed around each dummy gate structure, using known techniques, for example, depositing a dielectric spacer material layer conformally around each dummy gate structure and then performing an anisotropic etch process to remove the dielectric spacer material from horizontal surfaces of each dummy gate structure and STI. The remaining vertical portion of the dielectric spacer material layer on the sidewalls of each dummy gate structure becomes gate sidewall spacers 107. Gate sidewall spacers 107 can be formed of low-k material such as silicon oxide based materials (SiO2, SiOC, SiOCN, etc.) or silicon nitride based materials (SiN, SiBCN, SiCN, etc) or other materials with similar functional properties.

Source-drain epitaxy contacts 109 are formed, e.g., by epitaxy growth, on edges of fins 103 between the dummy gate structures. Source-drain regions are formed in exposed portions of fins 103 to be adjacent to a respective channel region such that the channel region is positioned laterally between the source-drain recesses. Source-drain epitaxy contacts 109 are then formed, for example, using an epitaxial semiconductor deposition process. In one instance, source-drain epitaxy contacts 109 may be formed of silicon containing phosphorus (Si:P) in an n-type FET, or silicon germanium doped with boron (SiGe:B), Ge % [30-50%] in a p-type FET.

Each dummy gate structure is selectively removed to provide a gate opening that exposes a channel region. A gate stack formed by RMG process typically includes one or more gate dielectric layers and one or more metal layers deposited onto the gate dielectric layers so as to fill gate openings. The materials and thicknesses of the dielectric and metal layers of the gate stack are selected based on work functions and FET conductivity types. For example, the final gate structure includes an inter-layer oxide and a high-k gate dielectric layer. The high-k gate dielectric layer may be formed of a dielectric material with a dielectric constant that is greater than 3.9, e.g., hafnium (IV) oxide (HfO$_2$), zirconium dioxide (ZrO$_2$) or any other material with similar functional properties. The layers within the gate structure are not illustrated in the drawings for simplification. Techniques for selective removal of dummy gate structures and forming the final gate stack and self-aligned contact cap (SAC Cap) are known in the art and omitted from this specification in order to allow the reader to focus on the salient aspects of the disclosed methods. Each gate structure post RMG process includes HKMG 101, a SAC Cap 111, and gate sidewall spacer 107 as depicted in FIG. 2. Materials for the gate include metals selected from titanium nitride (TiN), tantalum nitride (TaN), titanium aluminum (TiAl), aluminum-doped titanium carbide (TiAlC), titanium carbide (TiC), tungsten (W) and/or cobalt (Co). Materials for the SAC Cap 111 include silicon nitride (SiN) or other suitable materials with similar properties.

In FIG. 2, an OPL 115 is deposited over an interlayer dielectric (ILD) 113, such as silicon dioxide (SiO$_2$), and over the structure as a patterning layer. In accordance with an embodiment of the present invention, the OPL 115 may be an organic polymer including carbon, hydrogen and nitrogen. Non-limiting examples of the OPL 115 include JSR HM8006, JSR HM8014, AZ UM10M2, Shin Etsu ODL 102, or other similar commercially available materials from such vendors as JSR, TOK, Sumitomo, Rohm & Haas, etc. The OPL 115 can be deposited, for example, by spin coating and excess OPL 115 is etched back. An anti-reflection layer (not shown), e.g., of titanium dioxide ($TiO_2$), silicon-based anti-reflective coating (SiARC), low-temperature silicon oxide (LTO), silicon oxynitride (SiON) or any other material with similar functional properties, along with a photoresist stack (not shown) is deposited on the OPL 115. After patterning lithography, TS cavities 117 are formed by RIE or any other similar etching processes in the active region of the device. During the formation of the TS cavities 117, significant gate spacer erosion 107a and partial gate cap erosion 111a can occur during the RIE.

Figure 3:
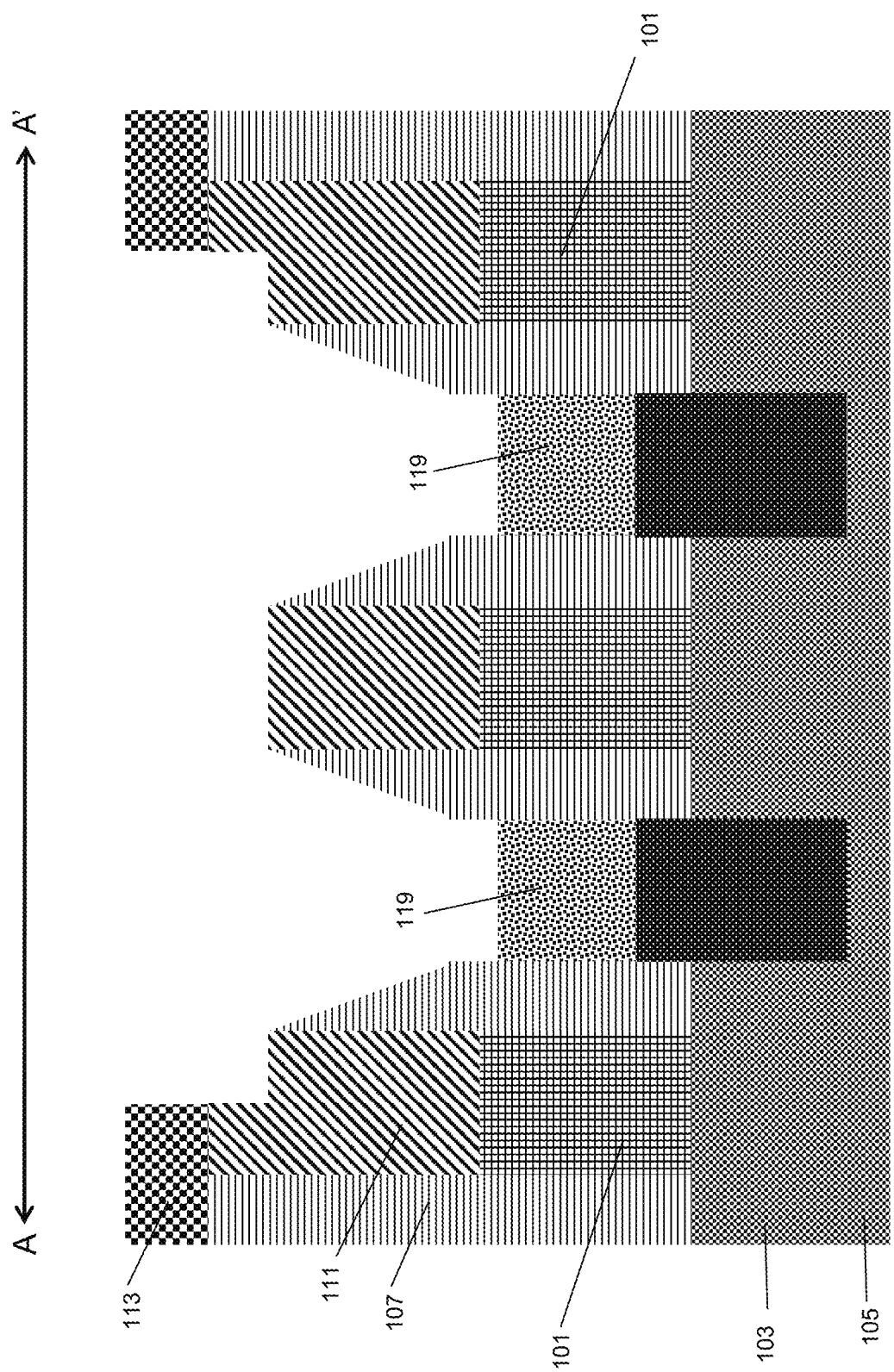
Figure 4:
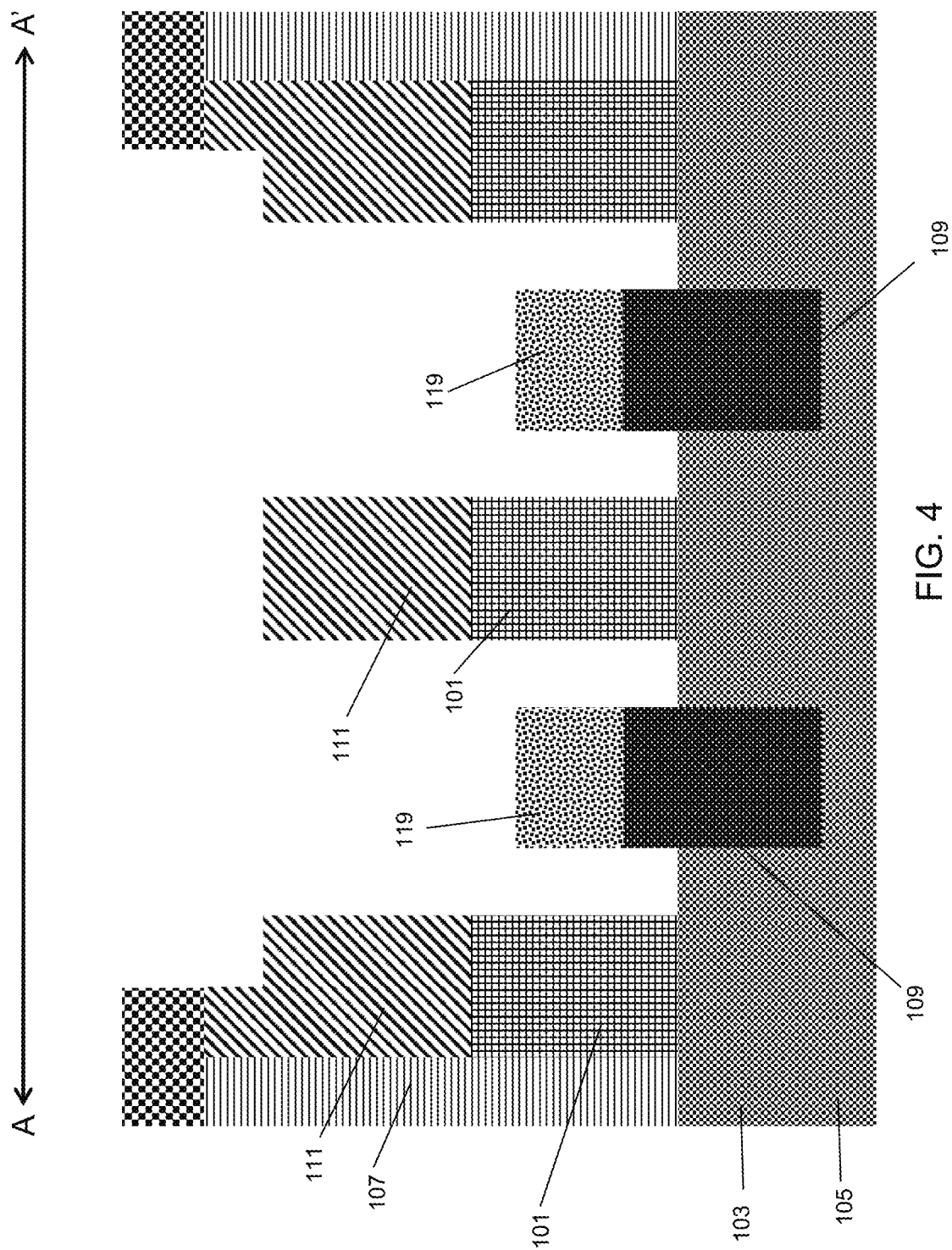

As shown in FIG. 3, an OPL 119 fill is performed and then recessed such that the OPL 119 fills the TS cavities 117. A top portion of the OPL 119 is below a top portion of HKMG 101. In FIG. 4, a selective spacer removal is done to remove gate spacers 107 between the HKMGs 101 and source-drain epitaxy contacts 109. An important benefit achieved with this step is the gate spacer 107 removal is much easier since most of the gate spacer 107 in a top region is already exposed and can be easily removed by an isotropic etch which is selective to the gate cap 111 and OPL 119.

Figure 5:
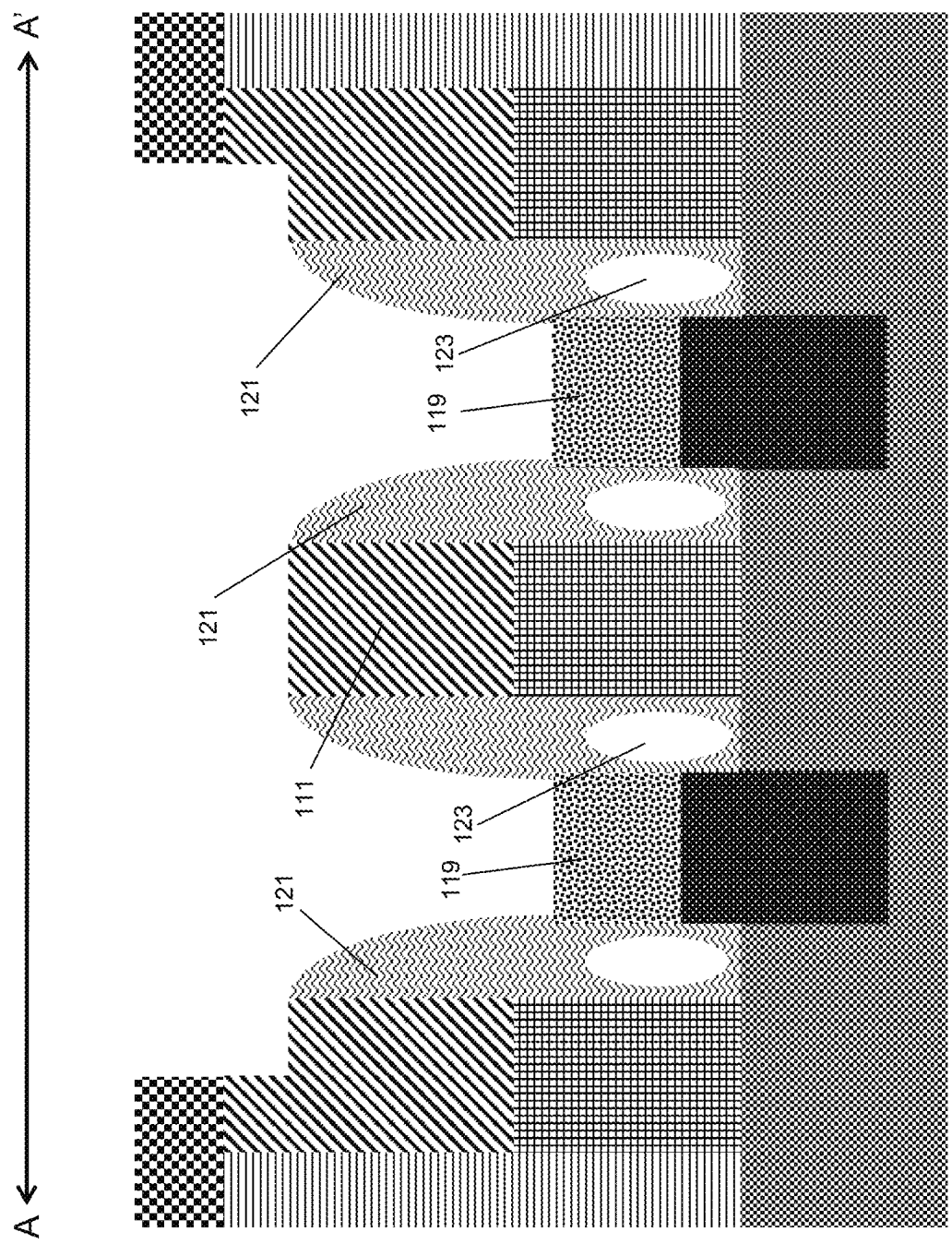
Figure 6:
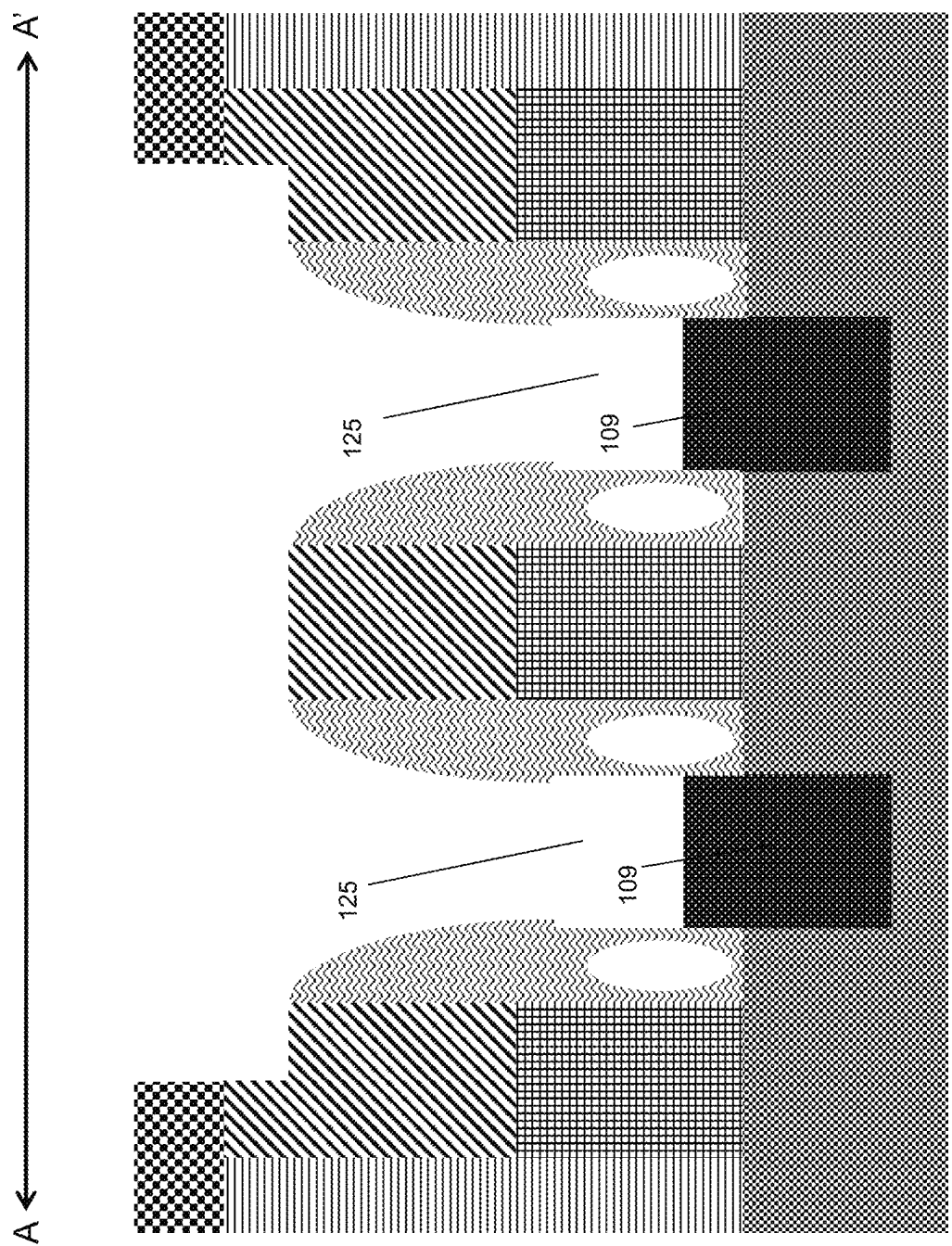

As shown in FIG. 5, air-gap spacers 121 are formed by a deposition step and spacer RIE. The air-gap 123 is formed below a top of HKMG 101 to prevent gate contact interaction with the air-gap 123. Air-gap spacers 121 have a spacer width of 5 to 15 nm and are formed of a low-k material such as silicon oxide based materials ($SiO_2$, SiOC, SiOCN, etc) or silicon nitride based materials (SiN, SiBCN, SiCN, etc.) or other materials with similar functional properties. The spacer material is deposited using a conformal deposition process, such as atomic-layer-deposition (ALD), plasma-enhanced chemical vapor deposition (PECVD), and pinch-off mechanism to trigger the encapsulation of air-gap 123. The air-gap spacers are located along a TS region. The air-gap 123 is formed between the HKMG 101 and the OPL 119. The As shown in FIG. 6, the OPL 119 is removed by etching, ashing or other suitable techniques to form openings 125 over source-drain epitaxy contacts 109.

Figure 7:
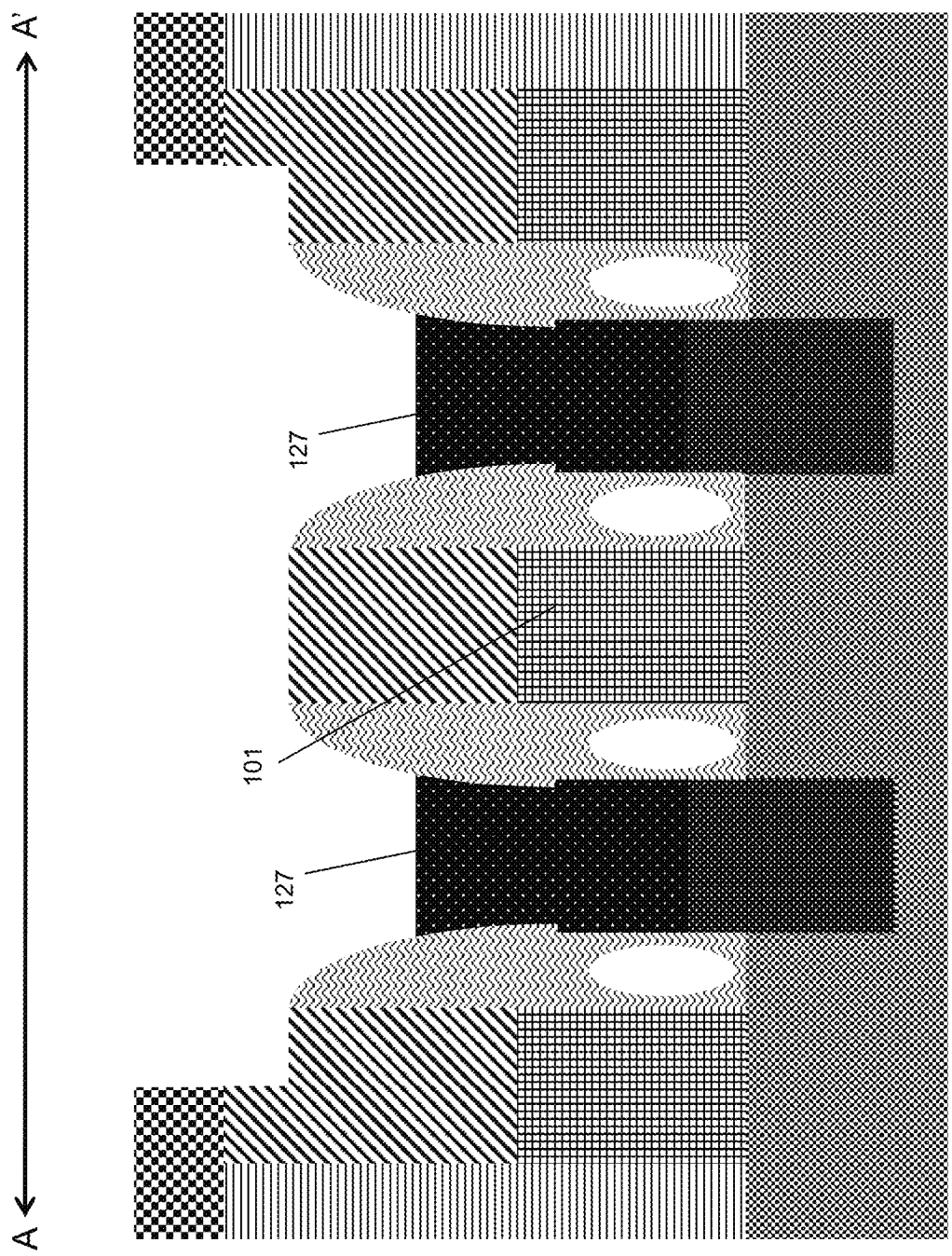

In FIG. 7, TS contacts 127 are formed by a metallization process. In one embodiment, the TS contacts 127 are formed by depositing tungsten (W), cobalt (Co), or ruthenium (Ru) followed by a recess step to remove excess metal. In one instance, a TS liner (not shown) may be formed in the openings 125 prior to forming the TS contacts 127. For example, the TS liner can be selected to match the materials of TS contacts 127, e.g., when TS contacts 127 are formed of W, the TS liner may be formed of titanium (Ti). The recess level of the TS contacts 127 is formed above a top of the HKMG 101. In certain embodiments the recess level can be 10 to 30 nanometers above the top of the HKMG 101.

Figure 8:
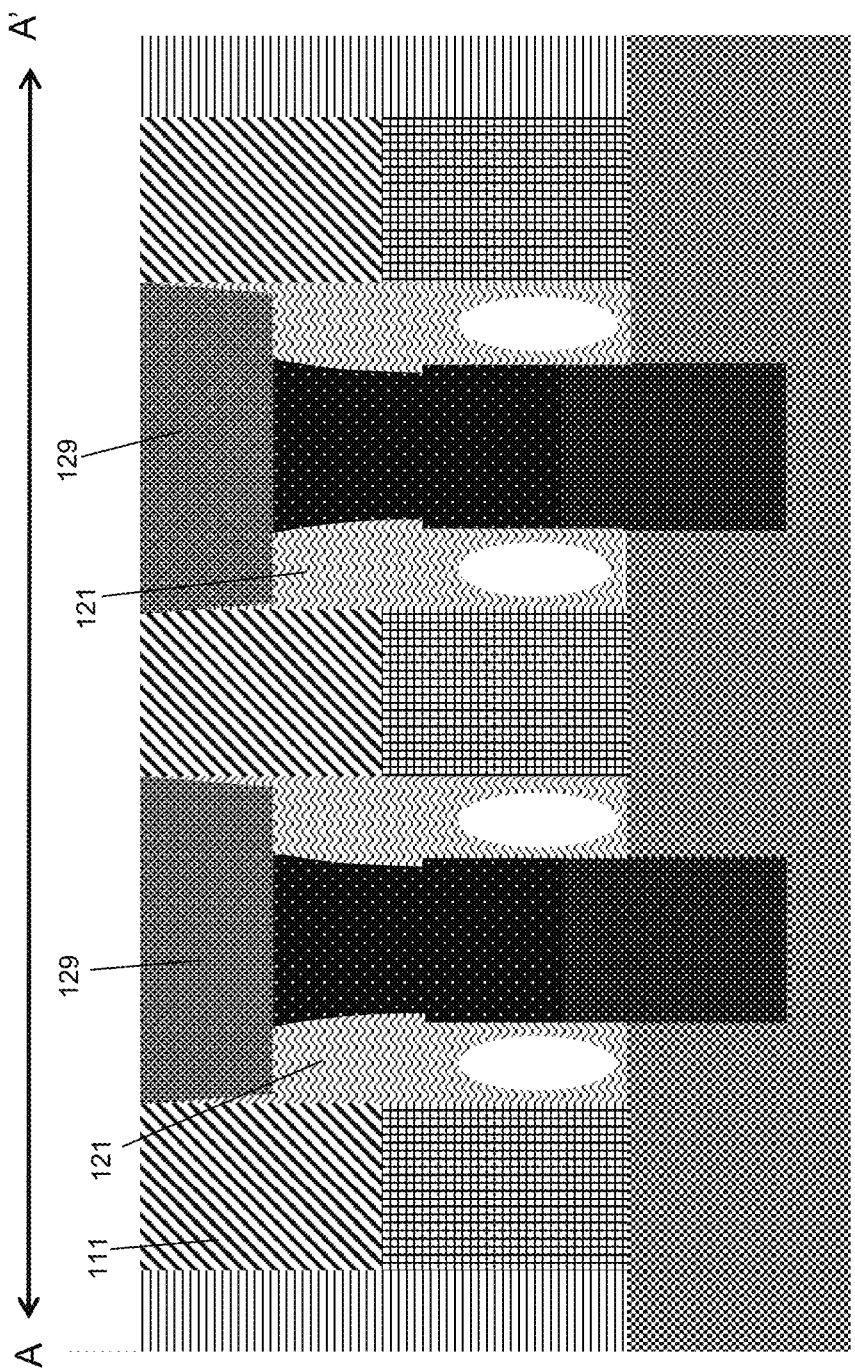

In FIG. 8, a TS cap 129 is formed over the TS contacts 127. Exposed portions of the air-gap spacers 121 are removed by an etching step such as hot phosphoric acid for nitride based spacer materials or hydrofluoric acid for oxide based spacer materials. Next, TS caps 129 are formed over the TS contacts 127. In certain embodiments, the TS caps can be formed of silicon carbide (SiC) or other suitable materials with similar properties. A chemical mechanical polishing (CMP) can be performed to remove excess TS caps 129 to be substantially coplanar with the gate cap 111.

Figure 9:
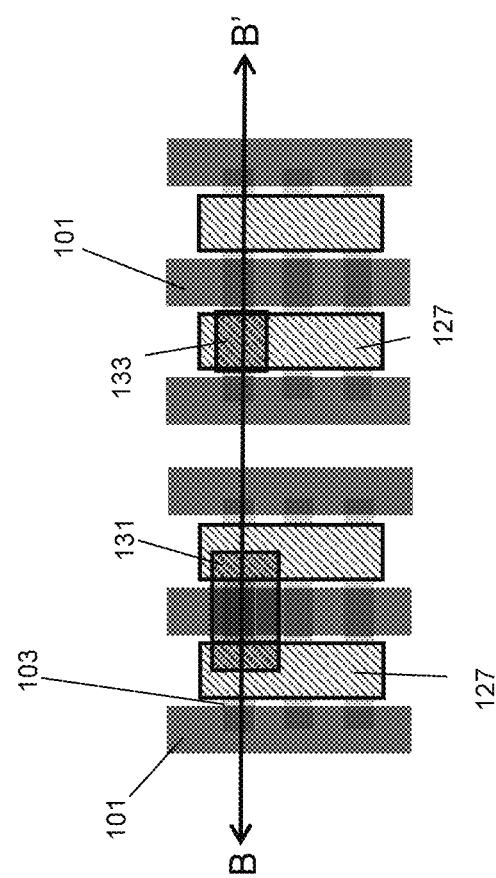
FIG. 9 is another top view of the logic or memory cell, in accordance with an exemplary embodiment.

FIG. 9 schematically illustrates another top view of a logic or memory cell with gates 101 and fins 103. Cut line B-B' is shown along fins 103 and across gates 101 in two different regions of the substrate 105. Gate contact 131 and source/drain contact 133 are shown as well as TS contacts 127.

Figure 10:
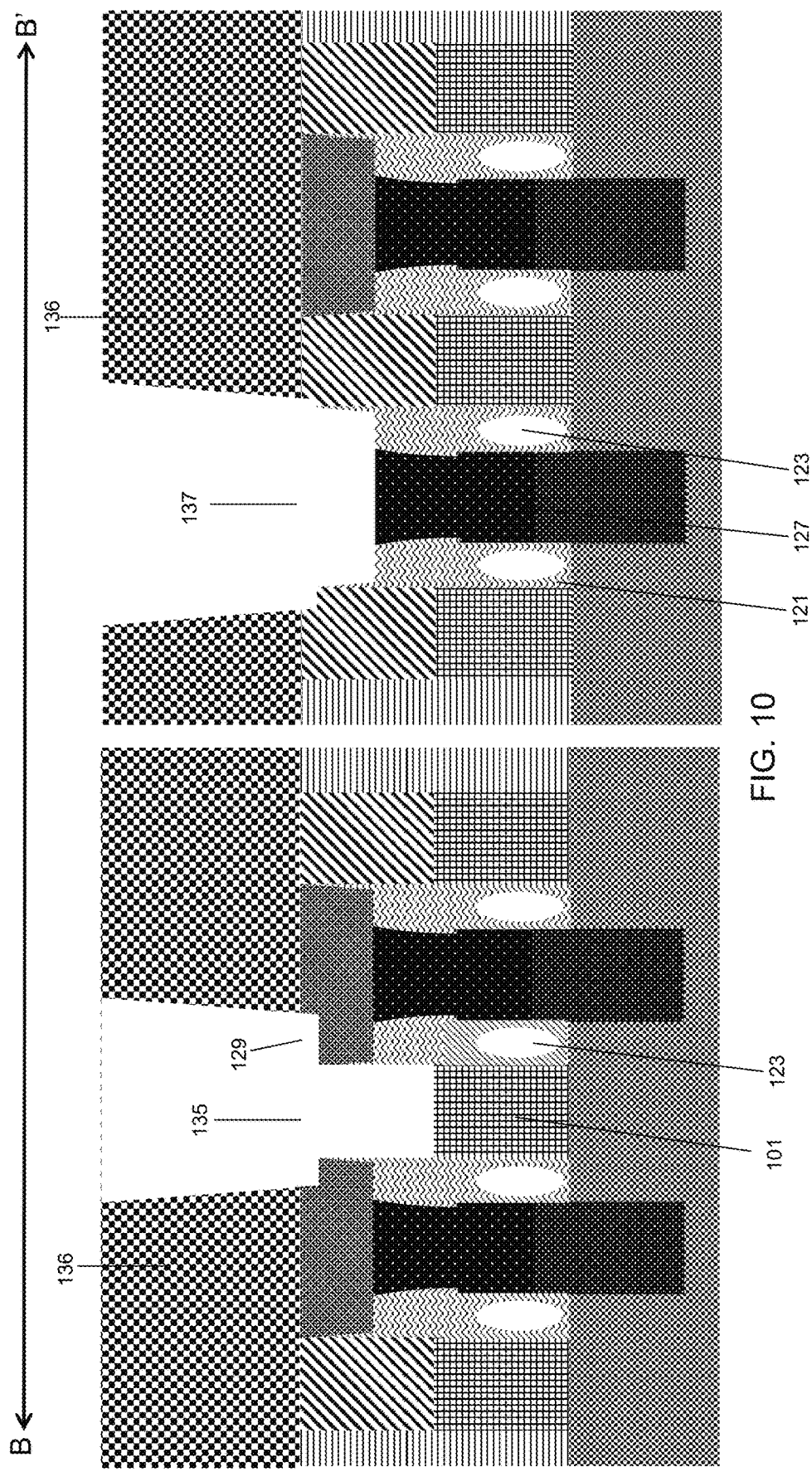
FIGS. 10 and 11 schematically illustrate cross-sectional views of the process flow for forming self-aligned gate contacts and source/drain contacts in a FinFET, along the cut lines B-B', in accordance with an exemplary embodiment.
Figure 11:
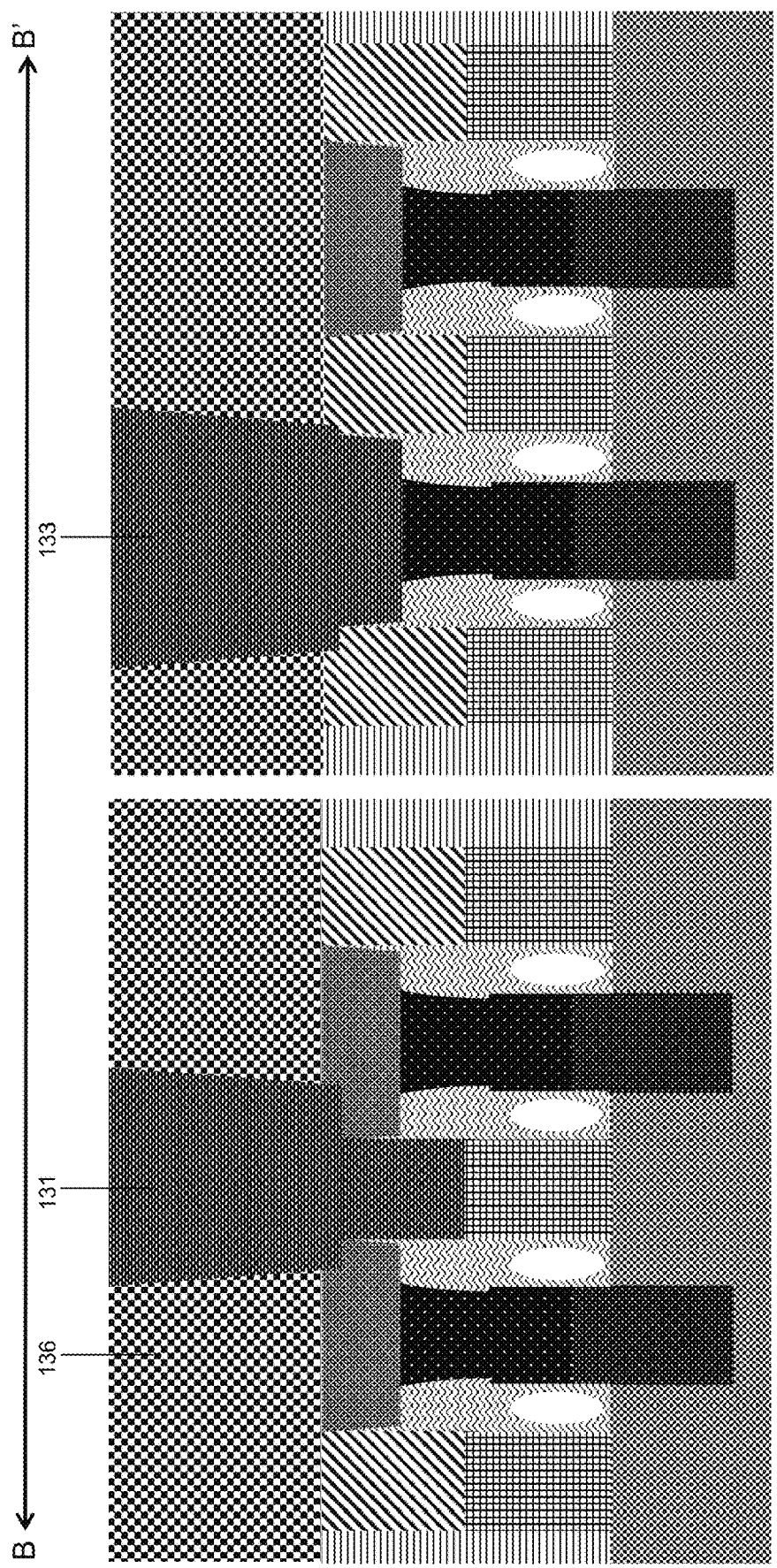

FIGS. 10 and 11 schematically illustrate cross-sectional views along cut line B-B' of FIG. 9. A self-aligned RIE is performed to form opening 135 for gate contacts 131 and opening 137 for source/drain contact 133. Opening 135 extends down through ILD 136 to a top surface of the HKMG 101. The gate cap 111 is removed and portions of TS caps 129 are removed by the RIE. The opening 135 is over the active region but does not reach the air-gaps 123 which are below a top surface of the HKMG 101. As a result, electrical shorts are prevented. The process of the present invention is fully compatible with gate-contact-over-active-area. Opening 137 extends down through ILD 136 to the TS contacts 127 and air-gap spacers 121 but does not reach the air-gaps 123 which are located near the bottom or lower level of the air-gap spacers 121. As a result, electrical shorts are prevented. As shown in FIG. 11, a metallization process is performed to deposit a metal in openings 135 and 137 to form gate contact 131 and source/drain contact 133, respectively. A CMP step can be performed to remove excess metallization down to an upper surface of the ILD 136.

The embodiments of the present disclosure can achieve several technical effects including providing improved air-gap spacers that are fully compatible with gate-contact-over-active-area, and are not susceptible to either gate contact subway issues or source/drain contact subway issues. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of semiconductor devices including logic or memory cells, particularly in the 14 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising: a substrate; at least one fin formed over the substrate; at least one transistor integrated with the fin at a top portion of the fin, the transistor comprising: an active region comprising a source, a drain and a channel region between the source and drain; a gate structure over the channel region, the gate structure comprising a high dielectric constant metal gate (HKMG) and first air-gap spacers formed on opposite sidewalls of the HKMG, wherein each of the first air-gap spacers comprises an air gap that is formed along a first trench silicide (TS) region, and the aft-gap is formed below a top of the HKMG, wherein the first TS region comprises first TS metallization formed over the source and drain; a gate contact formed over the active region; and a source/drain contact formed over a second TS region comprising second TS metallization in a second region of the substrate, wherein the source/drain contact directly contacts second aft gap spacers formed along the second TS region, wherein the gate contact and source/drain contact are self-aligned.

2. The device according to claim 1, further comprising a TS cap formed over the first TS metallization.

3. The device according to claim 1, wherein the TS cap comprises silicon carbide (SiC).

4. The device according to claim 1, wherein the source and drain are epitaxial source and drain.

5. A method comprising:
   forming at least one fin on a semiconductor substrate;
   forming at least one active region having a source, a drain, and a channel region between the source and drain;
   forming at least one gate structure over the channel region, the gate structure comprising a high dielectric constant metal gate (HKMG) and first air-gap spacers formed on opposite sidewalls of the HKMG,
   wherein each of the first air-gap spacers comprises an air gap that is formed along a first trench silicide (TS) region, and the air-gap is formed below a top of the gate electrode, wherein the first TS region comprises first TS metallization formed over the source and drain;
   forming a gate contact over the gate electrode; and
   forming a source/drain contact formed over a second TS region comprising second TS metallization in a second region of the substrate, wherein the source/drain contact directly contacts second air gap spacers formed along the second TS region,
   wherein the gate contact and source/drain contact are self-aligned.

6. The method according to claim 5, further comprising: forming a TS cap over the first TS metallization.

7. The method according to claim 6, wherein the TS cap comprises silicon carbide (SiC).

8. The method according to claim 6, further comprising: forming self-aligned gate contact over the gate electrode.

9. The method according to claim 5, wherein the source and drain are epitaxial source and drain.

10. The method according to claim 8, wherein the first air-gap spacers comprise a material selected from a silicon oxide based material or silicon nitride based material.

11. A device comprising:
    a substrate;
    a first fin and second fin formed over the substrate;
    a first transistor integrated with the first fin at a top portion of the first fin in a first region of the substrate, and a second transistor integrated with the second fin at a top portion of the second fin in a second region of the substrate, the first transistor comprising:
       an active region comprising a source, a drain and a channel region between the source and drain;
       a gate structure over the channel region, the gate structure comprising a high dielectric constant metal gate (HKMG) and first air-gap spacers formed on opposite sidewalls of the HKMG,
       wherein each of the first air-gap spacers comprises an air gap that is formed along a first trench silicide (TS) region, and the air-gap is formed below a top of the HKMG;
       a self-aligned gate contact formed over the active region of the first transistor; and
       a self-aligned source/drain contact formed over a second TS region comprising second TS metallization in a second region of the substrate, wherein the source/drain contact directly contacts second air gap spacers formed along the second TS region.

12. The device according to claim 11, wherein the first TS region comprises TS metallization formed over the source and drain of the first transistor.

13. The device according to claim 12, further comprising a TS cap formed over the first TS metallization.

14. The device according to claim 13, wherein the TS cap comprises silicon carbide (SiC).

15. The device according to claim 11, wherein:
    the first source and drain of the first transistor are epitaxial source and drain, and
    the first air-gap spacers comprise a material selected from a silicon oxide based material or silicon nitride based material.

16. The device according to claim 1, further comprising a second TS cap formed over the first TS metallization.

17. The device according to claim 5, further comprising a second TS cap formed over the first TS metallization.

18. The device according to claim 11, wherein the second air-gap spacers comprise a material selected from a silicon oxide based material or silicon nitride based material.

* * * * *